US012057473B2

(12) United States Patent
Siemieniec et al.

(10) Patent No.: US 12,057,473 B2
(45) Date of Patent: Aug. 6, 2024

(54) SILICON CARBIDE DEVICE WITH TRANSISTOR CELL AND CLAMP REGIONS IN A WELL REGION

(71) Applicant: Infineon Technologies AG, Neubiberg (DE)

(72) Inventors: Ralf Siemieniec, Villach (AT); Wolfgang Jantscher, Villach (AT); David Kammerlander, Villach (AT); Dethard Peters, Hoechstadt (DE); Joachim Weyers, Hoehenkirchen (DE)

(73) Assignee: Infineon Technologies AG, Neubiberg (DE)

( * ) Notice: Subject to any disclaimer, the term of this patent is extended or adjusted under 35 U.S.C. 154(b) by 493 days.

(21) Appl. No.: 17/489,365

(22) Filed: Sep. 29, 2021

(65) Prior Publication Data

US 2022/0102487 A1   Mar. 31, 2022

(30) Foreign Application Priority Data

Sep. 30, 2020 (EP) ..................................... 20199315

(51) Int. Cl.
*H01L 29/06* (2006.01)
*H01L 29/10* (2006.01)
(Continued)

(52) U.S. Cl.
CPC ...... *H01L 29/0626* (2013.01); *H01L 29/1095* (2013.01); *H01L 29/1608* (2013.01); *H01L 29/7813* (2013.01)

(58) Field of Classification Search
CPC ............ H01L 29/0626; H01L 29/1095; H01L 29/1608; H01L 29/7813
(Continued)

(56) References Cited

U.S. PATENT DOCUMENTS

2017/0194438 A1   7/2017   Kumagai et al.
2018/0301537 A1   10/2018  Weyers et al.
(Continued)

FOREIGN PATENT DOCUMENTS

JP   S54112179 A   9/1979
JP   S62186565 A   8/1987
(Continued)

OTHER PUBLICATIONS

Yen, Cheng-Tyng, et al., "SiC MOSFET with Integrated Zener Diode as an Asymmetric Bidirectional Voltage Clamp Between the Gate and Source for Overvoltage Protection", Proceedings of the 31st International Symposium on Power Semiconductor Devices & ICs, Shanghai, China, May 19-23, 2019, pp. 1-4.

*Primary Examiner* — Igwe U Anya
(74) *Attorney, Agent, or Firm* — Murphy, Bilak & Homiller, PLLC

(57) ABSTRACT

A transistor cell includes a gate electrode and a source region of a first conductivity type. A drain/drift region is formed in a silicon carbide body. A buried region of the second conductivity type and the drain/drift region form a pn junction. The buried region and a well region form a unipolar junction. A mean net dopant density $N_2$ of the buried region is higher than a mean net dopant density $N_1$ of the well region. A first clamp region of the first conductivity type extends into the well region. A first low-resistive ohmic path electrically connects the first clamp region and the gate electrode. A second clamp region of the first conductivity type extends into the well region. A second low-resistive ohmic path electrically connects the second clamp region and the source region.

14 Claims, 12 Drawing Sheets

(51) Int. Cl.
    *H01L 29/16*     (2006.01)
    *H01L 29/78*     (2006.01)

(58) Field of Classification Search
    USPC .......................................................... 257/547
    See application file for complete search history.

(56) References Cited

U.S. PATENT DOCUMENTS

| | | |
|---|---|---|
| 2020/0161466 A1 | 5/2020 | Yen et al. |
| 2021/0273088 A1* | 9/2021 | Basler ................... H01L 29/405 |
| 2022/0102549 A1* | 3/2022 | Weyers ............... H01L 29/7397 |

FOREIGN PATENT DOCUMENTS

| | | | |
|---|---|---|---|
| JP | S648674 A | 1/1989 | |
| JP | H0794730 A | 4/1995 | |

* cited by examiner

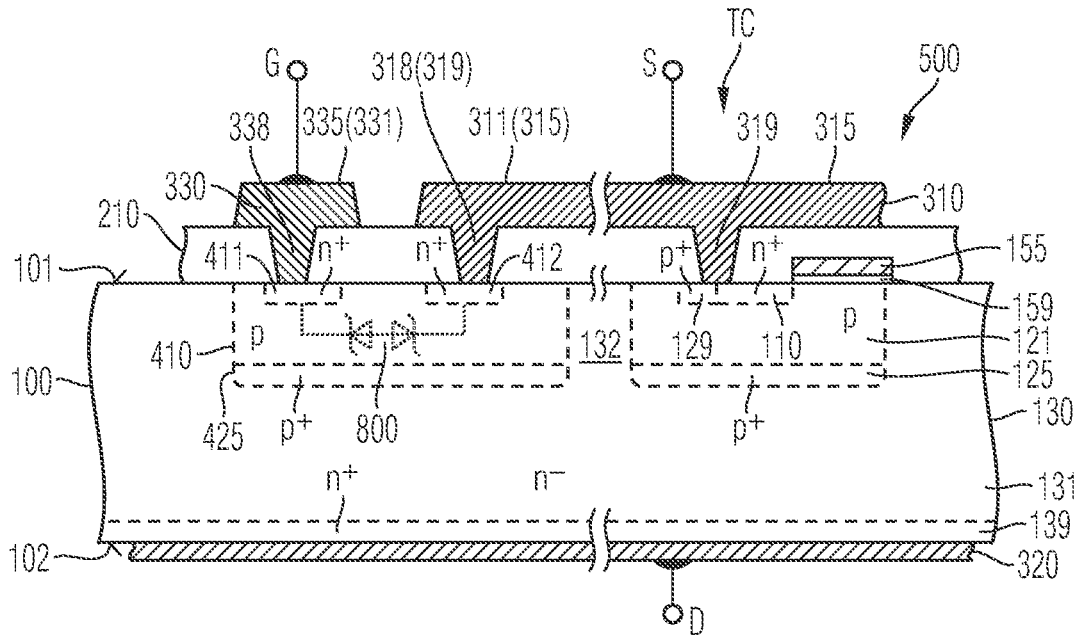
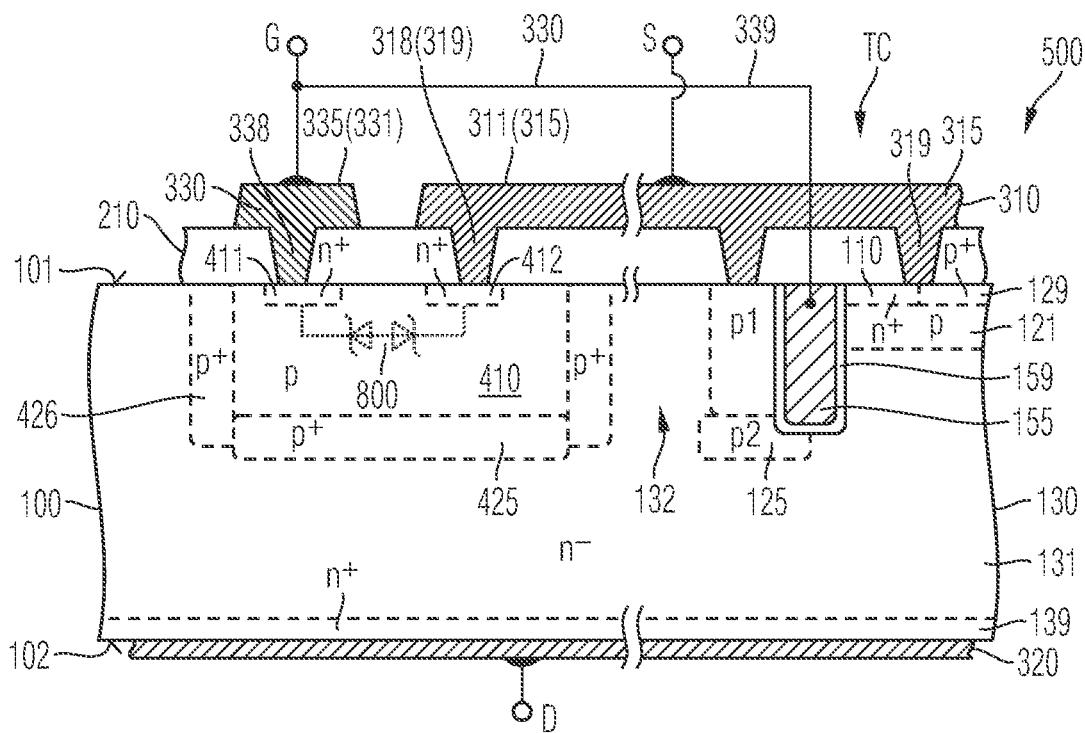

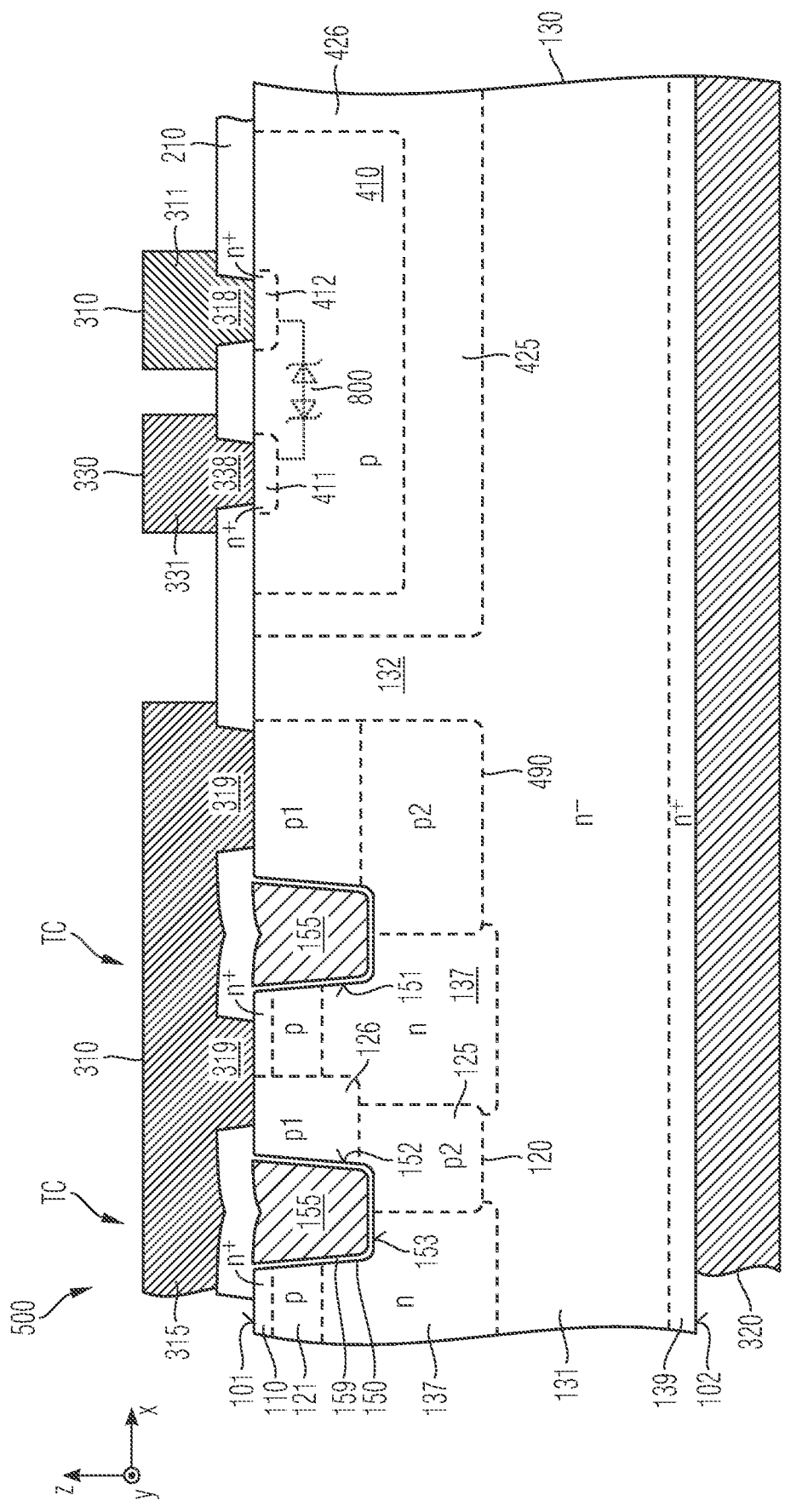

SILICON CARBIDE DEVICE WITH TRANSISTOR CELL AND CLAMP REGIONS IN A WELL REGION

TECHNICAL FIELD

Examples of the present disclosure relate to a silicon carbide device with transistor cells, in particular to a semiconductor device with an insulated gate transistor cell and a clamp between a gate electrode and a source electrode of the transistor cell.

BACKGROUND

Power semiconductor devices are typically used as switches and rectifiers in electric circuits for transforming electrical energy, for example, in DC/AC converters, AC/AC converters or AC/DC converters, and in electric circuits that drive heavy inductive loads, e.g. in motor driver circuits. Since the dielectric breakdown field strength of silicon carbide (SiC) is high compared to silicon (Si), SiC power devices may be significantly thinner and may show lower on-state resistance than their silicon counterparts. Integrated protection elements and/or protection circuits increase device reliability at the cost of additional process complexity.

There is a need to increase reliability of silicon carbide devices with little effort.

SUMMARY

An embodiment of the present disclosure relates to a silicon carbide device. The silicon carbide device includes a transistor cell with a gate electrode and a source region of a first conductivity type. The silicon carbide device further includes a drain/drift region formed in a silicon carbide body, a well region of a second conductivity type, and a buried region of the second conductivity type. The buried region and the drain/drift region form a pn junction. The buried region and the well region form a unipolar junction. A mean net dopant density $N_2$ of the buried region is higher than a mean net dopant density $N_1$ of the well region. A first clamp region of the first conductivity type extends into the well region. A first low-resistive ohmic path electrically connects the first clamp region and the gate electrode. A second clamp region of the first conductivity type extends into the well region. A second low-resistive ohmic path electrically connects the second clamp region and the source region.

Another embodiment of the present disclosure relates to a further silicon carbide device. The silicon carbide device includes a transistor cell with a gate electrode and a source region of a first conductivity type. The silicon carbide device further includes a drain/drift region formed in a silicon carbide body, a well region of a second conductivity, and a lateral region of the second conductivity type. The lateral region and the drain/drift region form a pn junction. The lateral region and the well region form a unipolar junction. A mean net dopant density $N_3$ of the lateral region is higher than a mean net dopant density $N_1$ of the well region. A first clamp region of the first conductivity type extends into the well region. A first low-resistive ohmic path electrically connects the first clamp region and the gate electrode. A second clamp region of the first conductivity type extends into the well region. A second low-resistive ohmic path electrically connects the second clamp region and the source region.

A further embodiment of the present disclosure relates to another silicon carbide device. The silicon carbide device includes a transistor cell with a gate electrode and a source region of a first conductivity type. The silicon carbide device further includes a drain/drift region formed in a silicon carbide body and a well region of a second conductivity type. A first clamp region of the first conductivity type extends into the well region. A first low-resistive ohmic path electrically connects the first clamp region and the gate electrode. A second clamp region of the first conductivity type extends into the well region. A second low-resistive ohmic path electrically connects the second clamp region and the source region. The well region includes a main portion and an enhanced portion. A mean net dopant density in the enhanced portion is higher than in the main portion. At least a first part of the enhanced portion is between the first clamp region and the second clamp region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a silicon carbide device and together with the description serve to explain principles of the embodiments. Further embodiments are described in the following detailed description and the claims.

FIGS. 2A-2B show schematic vertical cross-sectional views of portions of silicon carbide devices with clamp regions, gate metallization, first load metallization and second load metallization according to further embodiments.

FIG. 4 shows a schematic vertical cross-sectional view of a portion of a silicon carbide device with transistor cells and an integrated bidirectional clamp according to an embodiment.

DETAILED DESCRIPTION

Figure 1A:
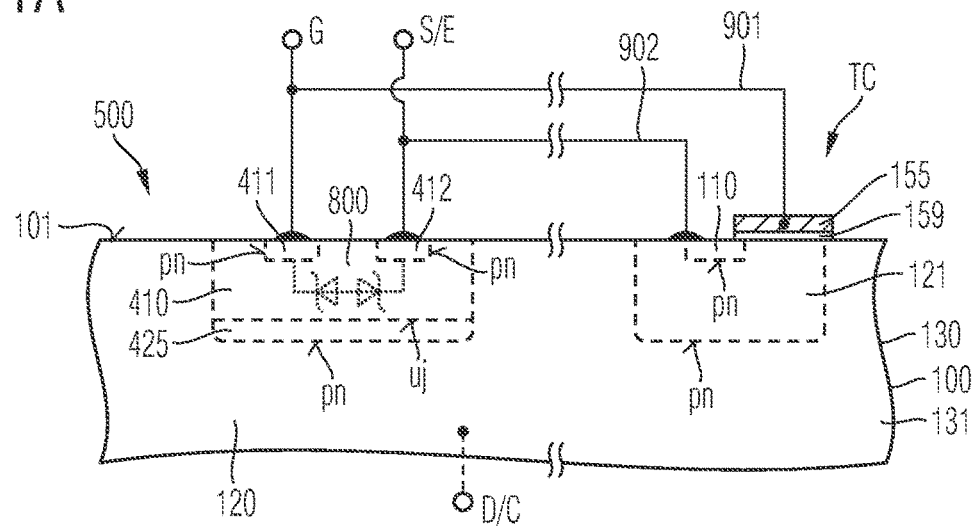
FIGS. 1A-1B show schematic vertical cross-sectional views of portions of silicon carbide devices with clamp regions of bidirectional clamps according to embodiments.

In the following detailed description, reference is made to the accompanying drawings, which form a part hereof and in which are shown by way of illustrations specific embodiments in which a silicon carbide device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An "ohmic contact" is a non-rectifying electrical junction with a linear or almost linear current-voltage characteristic.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. The same holds for ranges with one boundary value like "at most" and "at least".

The term "on" is not to be construed as meaning "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

The terms "power semiconductor device" and "SiC power device" refer to semiconductor devices with a high voltage blocking capability of at least 30 V, for example 100 V, 600 V, 1.6 kV, 3.3 kV or more and with a nominal on-state current or forward current of at least 1 A, for example 10 A or more.

An ohmic contact describes a non-rectifying electrical junction between two conductors. The ohmic contact has a linear or approximately linear current-voltage (I-V) curve in the first and third quadrant of the I-V diagram as with Ohm's law.

A silicon carbide device may include a transistor cell with a gate electrode and a source region. The source region may be formed in a silicon carbide body and has a first conductivity type.

The silicon carbide body may have two essentially parallel main surfaces, which may have approximately the same shape and size, and a lateral surface connecting the edges of the two main surfaces. For example, the silicon carbide body may be a cylinder or a polygonal, e.g. rectangular or hexagonal, prism with or without rounded edges. The silicon carbide body may have a surface extension along two horizontal directions and may have a thickness along a vertical direction perpendicular to the horizontal directions. The horizontal directions are also referred to as lateral directions in the following.

The material of the silicon carbide body may be single-crystalline silicon carbide, for example 15R—SiC (silicon carbide of 15R-polytype), or silicon carbide with hexagonal polytype like 2H—SiC, 4H—SiC or 6H—SiC, by way of example. In addition to the main constituents silicon and carbon, the silicon carbide body may include dopant atoms, for example nitrogen (N), phosphorous (P), beryllium (Be), boron (B), aluminum (Al) and/or gallium (Ga). The silicon carbide body may include further impurities, for example hydrogen, fluorine and/or oxygen.

The transistor cell may be or may include an insulated gate transistor cell with an insulated gate electrode. The gate electrode may be a planar gate electrode formed on a main surface of the silicon carbide body or may be a trench gate electrode formed in a trench extending from a main surface into the silicon carbide body.

The silicon carbide body may further include a drain/drift region. At least a portion of the drain/drift region may have the first conductivity type and may be effective as the drain of the transistor cell.

The transistor cell may further include a body region of a complementary second conductivity type. The body region may spatially separate the source region and the portion of the drain/drift region with the first conductivity type. A gate dielectric may be formed between the gate electrode and the body region. An electric potential applied to the gate electrode controls the distribution of mobile charge carriers in the body region by field effect.

The silicon carbide device may further include a well region and a buried region. The well region and the buried region may have the second conductivity type and may form a unipolar junction. The buried region and the drain/drift region may form a pn junction. The well region may be floating or may be connected to other doped regions of the same conductivity type through a comparatively high-ohmic connection.

The well region has a first mean net dopant density $N_1$. The buried region has a second mean net dopant density $N_2$. The second mean net dopant density $N_2$ may be higher than the first mean net dopant density $N_1$. For example, the second mean net dopant density $N_2$ may be at least two times, at least five times or at least ten times higher than the first mean net dopant density $N_1$.

A first clamp region may extend into the well region. The first clamp region may have the first conductivity type. The first clamp region and the well region form a pn junction. The well region may laterally surround the first clamp region within the silicon carbide body.

A first low-resistive ohmic path may electrically connect the first clamp region and the gate electrode. The ohmic resistance of the first low-resistive ohmic path may be at most 2Ω, e.g. at most 1Ω, or at most 0.5Ω.

A second clamp region may extend into the well region. The second clamp region may have the first conductivity type. The second clamp region and the well region may form a pn junction. The well region may laterally surround the second clamp region within the silicon carbide body. The first clamp region and the second clamp region may be laterally separated.

A second low-resistive ohmic path may electrically connect the second clamp region and the source region. The ohmic resistance of the second low-resistive ohmic path may be at most 2Ω, e.g. at most 1Ω, or at most 0.5Ω.

The first clamp region, the well region and the second clamp region may form a bidirectional clamp effective between the gate electrode and the source region. An avalanche breakdown of the pn junction between the first clamp region and the well region may define the clamp voltage for positive voltage transients between gate electrode and source region. The transient is directly short-circuited through the forward-biased pn junction between the well region and the second clamp region.

An avalanche breakdown of the pn junction between the second clamp region and the well region may define an upper clamp voltage for negative voltage transients between the gate electrode and the source region.

In case the well region is floating or has a sufficiently high-ohmic connection to the source region and, in addition, has sufficient distance to other doped regions of the second conductivity type and connected to the source region, the avalanche breakdown of the pn junction between the second clamp region and the well region may define the clamp voltage for negative voltage transients between the gate electrode and the source region. Both clamp voltages may have the same amount. The bidirectional clamp may be highly symmetric.

The bidirectional clamp may protect the transistor cell against overvoltage events. In particular the bidirectional clamp may reliably protect the gate dielectric, which in silicon carbide power devices can be to a high degree susceptible for overvoltage events, against fatal electrostatic discharge (ESD) events.

Due to the high intrinsic breakdown voltage of silicon carbide, the bidirectional clamp formed in the silicon carbide body may short-circuit and dissipate overvoltage events, e.g. ESD events, without being damaged. Due to the large band gap and the low intrinsic thermal carrier generation of silicon carbide, the leakage current through the bidirectional clamp is low compared to equivalent circuits in single crystalline silicon or in polycrystalline silicon.

The more heavily doped buried region may accommodate an electric field effective in the drain/drift region, e.g. a blocking voltage applied between the backside and the front side of the silicon carbide body. The buried region decouples the breakdown voltage of the bidirectional clamp to a high degree from an operational state of the silicon carbide device, in particular from a blocking voltage applied between the source region and the drain/drift region.

The total net dopant dose in the buried region may be sufficiently high such that when the nominal blocking voltage is applied between the two main surfaces of the silicon carbide body, a depletion region extending from the pn junction between the buried region and the drain/drift region into direction of the clamp regions does not merge with any of the depletion zones extending from the clamp regions into the well region.

In particular, a sufficiently high dopant dose in the buried region may avoid that a parasitic bipolar transistor turns of, which is formed by the clamp regions of the first conductivity type, the well region and the buried region of the second conductivity type, and a portion of the drift/drain structure of the first conductivity type.

According to an embodiment the silicon carbide device may include a lateral region of the second conductivity type, wherein the lateral region may laterally surround the well region. The lateral region and the well region may form a unipolar junction. The lateral region and the drain/drift region may form a pn junction.

The lateral region may extend from a first main surface at a front side of the silicon carbide body to or into the buried region. The buried region and the lateral region may form a contiguous shell around the well region in the silicon carbide body.

The lateral region has a third mean net dopant density $N_3$ that may be higher than the first mean net dopant density $N_1$ in the well region. For example, the third mean net dopant density $N_3$ may be at least two times, five times or at least ten times higher than the first mean net dopant density $N_1$. The third mean net dopant density $N_3$ may be lower than, equal to, or higher than the second mean net dopant density $N_2$ in the buried region.

The total net dopant dose in the lateral region may be sufficiently high such that when the nominal blocking voltage is applied to the silicon carbide device, a depletion region extending from the pn junction between the lateral region and a vertical portion of the drain/drift region into the direction of the clamp regions does not merge with any of the depletion zones laterally extending from the clamp regions into the well region.

The lateral region may contribute in decoupling the breakdown voltage of the bidirectional clamp from an operational state of the silicon carbide device, in particular from a blocking voltage applied between the source region and the drain/drift region.

According to an embodiment the silicon carbide device may include a gate metallization. The gate metallization may be formed on the first main surface at the front side of the silicon carbide body. The gate metallization may include a gate pad from a metallic material and/or one or more gate conductors from a metallic material. The metallic material may include one or more elemental metals, e.g. copper (Cu), aluminum (Al), titanium (Ti) or tantalum (Ta), one or more metal alloys, e.g. copper aluminum (CuAl), and/or one or more metal compounds, e.g. a metal silicide or a metal nitride.

The gate metallization and the gate electrode may be electrically connected to each other. For example, the gate pad and/or a gate conductor may be formed directly on a portion of the gate electrode, wherein the gate electrode and the gate pad and/or the gate electrode and the gate conductor form a low-resistive ohmic contact. Alternatively, the gate metallization may include a metallic gate contact structure extending from the gate pad and/or the gate conductor to the gate electrode, wherein the gate contact structure and the gate electrode form a low-resistive ohmic contact.

In addition, the gate metallization and the first clamp region may form a low-resistive ohmic contact. The gate pad and/or a gate conductor may be formed directly on a portion of the first clamp region, wherein the first clamp region and the gate pad and/or the first clamp region and the gate conductor form a low-resistive ohmic contact. Alternatively, the gate metallization may include a metallic clamp contact structure extending from the gate pad and/or the gate conductor to the first clamp region, wherein the clamp contact structure and the first clamp region form a low-resistive ohmic contact.

By forming the first clamp region directly below a portion of the gate metallization, the bidirectional clamp may be integrated in a space-saving and area-efficient way.

According to an embodiment the silicon carbide device may include a first load metallization. The first load metallization may be formed on the first main surface at the front side of the silicon carbide body. The first load metallization may include a load pad from a metallic material and/or one or more edge conductors from a metallic material. The metallic material may include one or more elemental metals, e.g. copper (Cu), aluminum (Al), titanium (Ti) or tantalum (Ta), one or more metal alloys, e.g. copper aluminum (CuAl), and/or one or more metal compounds, e.g. a silicide or a nitride.

The first load metallization and the source region may be electrically connected to each other. For example, the load pad may be formed directly on a portion of the source region, wherein the source region and the load pad form an ohmic contact. Alternatively, the first load metallization may include a metallic load contact structure extending from the load pad to the source region, wherein the load contact structure and the source region form a low-resistive ohmic contact.

In addition, the first load metallization and the second clamp region may form a low-resistive ohmic contact. The load pad and/or the edge conductor may be formed directly on a portion of the second clamp region, wherein the second clamp region and the load pad and/or the second clamp region and the edge conductor form a low-resistive ohmic contact.

According to another example, the first load metallization includes one or more further metal load contact structures extending from the load pad to or into the second clamp region, wherein the second clamp region and the further load contact structure form a low-resistive ohmic contact.

According to a further example, the first load metallization includes one or more metal edge contact structures extending from the edge conductor to or into the second clamp region, wherein the second clamp region and the edge contact structure form a low-resistive ohmic contact.

By forming the second clamp region directly below a portion of the first load metallization, the bidirectional clamp may be integrated in a space-saving and area-efficient way.

According to an embodiment the first load metallization and the lateral region and/or the first load metallization and the well region may form a low-resistive ohmic contact.

For example, the well region may include a heavily doped contact region of the second conductivity type, wherein the first load metallization and the contact region may form a low-resistive ohmic contact.

According to another example, at least a portion of the lateral region along the first main surface may be sufficiently doped such that the first load metallization and the lateral region may form a low-resistive ohmic contact.

The low-resistive ohmic contact between the first load metallization and the well region short-circuits the pn junction between the second clamp region and the well region. The set-in voltage of the pn junction between the well region and the first clamp region sets the clamp voltage for negative voltage transients between the gate electrode and the source region. The set-in voltage of the pn junction between the well region and the first clamp region may be in a range from 3V to 4V. In addition to typical ESD pulses, negative voltages pulses with a comparatively low amplitude and generated, e.g., by switching inductive loads may be short-circuited.

According to an embodiment the silicon carbide device may include an auxiliary well structure of the second conductivity type. The auxiliary well structure may be formed in a lateral distance to the well region and, if applicable, to the lateral region. A front side portion of the drain/drift region may be laterally formed between the well region and the auxiliary well structure, wherein the front side portion has the first conductivity type.

The auxiliary well structure may be a doped region that includes the body regions of transistor cells, by way of example. The first load metallization and the auxiliary well structure may form a further low-resistive ohmic contact.

The negative clamp voltage may be given by a defined breakdown voltage at which depletion layers laterally extending from the auxiliary well structure and from the well region or, if applicable from the lateral region, into the front side portion of the drain/drift region merge. The amount of the defined breakdown voltage may be lower than the Avalanche breakdown voltage of the pn junction between the second clamp region and the well region.

According to an embodiment the silicon carbide device may include a connection region of the second conductivity type, wherein the connection region may laterally extend from the well region or, if applicable, from the lateral region to the auxiliary well structure. The connection region may be comparatively high-resistive. Through the connection region, charge carriers may be discharged from the well region. The connection region may avoid a drift of the clamp voltages resulting from accumulated charge carriers in the well region. In addition the connection region may form a high resistive path in series between the first clamp region and the source potential such that a gate driver circuit driving a low gate potential for the off-state of the transistor cells drives a less low-resistive load than in case of a direct contact between the source potential and the well region or between the source potential and the lateral region.

According to an embodiment the bidirectional clamp including the first clamp region and the well region may be configured to carry a breakdown current of at least 0.5 A and for example at most 10 A, wherein the breakdown current flows between the first clamp region and the well region. The breakdown current may be in a range from 0.5 A to 2 A. Suitably configured first clamp regions and well regions facilitate dissipating standard ESD pulses according to the human body model without persistent damage of the silicon carbide body and/or the gate dielectric.

According to an embodiment the well region, the first clamp region, and the second clamp region may extend from the first main surface of the silicon carbide body into the silicon carbide body, wherein the bidirectional clamp may be formed in a cost-saving manner and by using implantation masks formed on the same surface.

According to an embodiment the well region may include a main portion and an enhanced portion. A mean net dopant concentration in the enhanced portion may be higher than in the main portion.

A first part of the enhanced portion may be formed between the first clamp region and the second clamp region. The enhanced portion may exclusively include the first part or may include further parts. The first part may be formed along only a section of a line connecting the first clamp region and the second clamp region.

The enhanced portion may facilitate fine-tuning the breakdown characteristic of the bidirectional clamp. In addition it may be possible to fix the position of the breakdown path in an uncritical portion of the silicon carbide body. For example, it is possible to locate the breakdown of the bidirectional clamp between the first clamp region and the second clamp region and within the well region such that functional elements outside the well region are hardly affected by a current flow within the bidirectional clamp.

The enhanced portion may extend from the first main surface into the well region.

According to an embodiment the enhanced portion may be spaced from the first main surface.

For example, a distance between a maximum dopant density in the enhanced portion and the first main surface may be greater than vertical extensions of the first and second clamp regions. The first and second clamp regions may extend from the first main surface to the enhanced portion.

In case of an Avalanche breakdown in the bidirectional clamp, the Avalanche current has a vertical component and a current flow along the first main surface can be completely avoided or significantly reduced, wherein injection of charge carriers into an interlayer dielectric formed on the first main surface can be suppressed to a high degree. A degrading of the bidirectional clamp due to charge carriers injected and built-in into the interlayer dielectric can be avoided.

According to an embodiment the enhanced portion may laterally surround the first clamp region and the second clamp region. For example, a second part of the enhanced portion between the first clamp region and the lateral sidewall of the well region and between the second clamp region and the lateral sidewall of the well region may decrease the influence of neighboring structures on the characteristics of the bidirectional clamp.

According to an example, the enhanced portion, in particular the second part of the enhanced portion, may be laterally separated from a lateral sidewall of the well region.

According to another embodiment, a silicon carbide device may include a transistor cell with a gate electrode and a source region. The source region may be formed in a silicon carbide body and has a first conductivity type.

The transistor cell may be or may include an insulated gate transistor cell with an insulated gate electrode. The gate electrode may be a planar gate electrode formed on a main surface of the silicon carbide body or may be a trench gate electrode formed in a trench extending from a main surface into the silicon carbide body.

A drain/drift region may be formed in the silicon carbide body. At least a portion of the drain/drift region may have the first conductivity type and may be effective as the drain of the transistor cell.

The silicon carbide device may further include a well region and a lateral region. The well region and the lateral region may have the second conductivity type and may form a unipolar junction in the silicon carbide body. The lateral region and the drain/drift region may form a pn junction.

The well region has a first mean net dopant density $N_1$. The lateral region has a third mean net dopant density $N_3$. The third mean net dopant density $N_2$ may be higher than the first mean net dopant density $N_1$. For example, the third mean net dopant density $N_2$ may be at least two times, at least five times or at least ten times higher than the first mean net dopant density $N_1$.

A first clamp region may extend into the well region. The first clamp region may have the first conductivity type. The first clamp region and the well region may form a pn junction. The well region may laterally surround the first clamp region within the silicon carbide body.

A first low-resistive ohmic path may electrically connect the first clamp region and the gate electrode. The ohmic resistance of the first low-resistive ohmic path may be at most 2Ω, e.g. at most 1Ω, or at most 0.5Ω.

A second clamp region may extend into the well region. The second clamp region may have the first conductivity type. The second clamp region and the well region may form a pn junction. The well region may laterally surround the second clamp region within the silicon carbide body. The first clamp region and the second clamp region may be laterally separated.

A second low-resistive ohmic path may electrically connect the second clamp region and the source region. The ohmic resistance of the second low-resistive ohmic path may be at most 2Ω, e.g. at most 1Ω, or at most 0.5Ω.

The first clamp region, the well region and the second clamp region form a bidirectional clamp effective between the gate electrode and the source region. The bidirectional clamp may protect the transistor cell against overvoltage events.

The more heavily doped lateral region may accommodate an electric field effective in the drain/drift region, e.g. a blocking voltage applied between the backside and the front side of the silicon carbide body. The lateral region may decouple the breakdown voltage of the bidirectional clamp from an operational state of the silicon carbide device, in particular from a blocking voltage applied between the source region and the drain/drift region.

According to another embodiment, a silicon carbide device may include a transistor cell with a gate electrode and a source region. The source region may be formed in a silicon carbide body and has a first conductivity type.

The transistor cell may be or may include an insulated gate transistor cell with an insulated gate electrode. The gate electrode may be a planar gate electrode formed on a main surface of the silicon carbide body or may be a trench gate electrode formed in a trench extending from a main surface into the silicon carbide body.

A drain/drift region may be formed in the silicon carbide body. At least a portion of the drain/drift region may have the first conductivity type and may be effective as the drain of the transistor cell.

The silicon carbide device may further include a well region. The well region may have the second conductivity type. The well region and the drain/drift region may form a pn junction.

A first clamp region may extend into the well region. The first clamp region may have the first conductivity type. The first clamp region and the well region may form a pn junction. The well region may laterally surround the first clamp region within the silicon carbide body.

A first low-resistive ohmic path may electrically connect the first clamp region and the gate electrode. The ohmic resistance of the first low-resistive ohmic path may be at most 2Ω, e.g. at most 1Ω, or at most 0.5Ω.

A second clamp region may extend into the well region. The second clamp region may have the first conductivity type. The second clamp region and the well region may form a pn junction. The well region may laterally surround the second clamp region within the silicon carbide body. The first clamp region and the second clamp region may be laterally separated.

A second low-resistive ohmic path may electrically connect the second clamp region and the source region. The ohmic resistance of the second low-resistive ohmic path may be at most 2Ω, e.g. at most 1Ω, or at most 0.5Ω.

The first clamp region, the well region and the second clamp region form a bidirectional clamp effective between the gate electrode and the source region. The bidirectional clamp may protect the transistor cell against overvoltage events.

The well region may include a main portion and an enhanced portion. A mean net dopant concentration in the enhanced portion may be higher than in the main portion. The enhanced portion may extend from the first main surface into the well region or may be formed at a distance to the first main surface.

A first part of the enhanced portion may be formed between the first clamp region and the second clamp region. The enhanced portion may exclusively include the first part or may include further parts. The first part may be formed along only a section of a line connecting the first clamp region and the second clamp region.

With the enhanced portion it may be possible to fine-tune the breakdown characteristic of the bidirectional clamp. In addition, it may be possible to fix the position of the breakdown path in an uncritical portion of the silicon carbide body. For example, it is possible to locate the breakdown of the bidirectional clamp between the first clamp region and the second clamp region and within the well region such that functional elements outside the well region are hardly affected by a current flow within the bidirectional clamp.

Figure 1B:
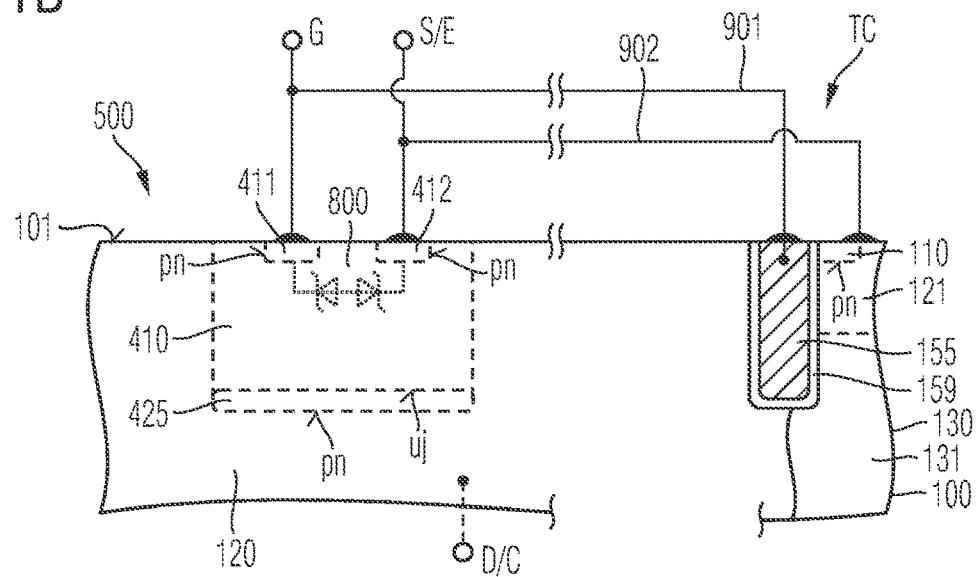
Figure 1C:
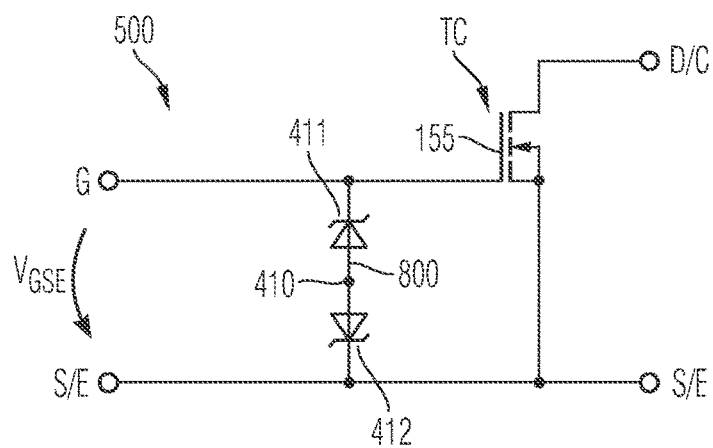
FIG. 1C shows a simplified circuit diagram of the silicon carbide devices of FIGS. 1A-1B.

FIGS. 1A-1C refer to silicon carbide devices 500 with a monolithically integrated bidirectional clamp 800. Each silicon carbide device 500 may be or may include an IGFET (insulated gate field effect transistor), for example an MOSFET (metal oxide semiconductor FET) or an IGBT (insulated gate bipolar transistor).

The silicon carbide body 100 shown in FIGS. 1A-1B includes or consists of single crystalline silicon carbide, e.g., a silicon carbide crystal including the main constituents silicon and carbon. The silicon carbide crystal may include dopant atoms and further impurities like hydrogen, fluorine and/or oxygen. The polytype of the silicon carbide crystal may be 15R or may be hexagonal, e.g. 2H, 6H, or 4H. The silicon carbide body 100 may include or consist of a silicon carbide layer grown by epitaxy.

A first main surface 101 at a front side of the silicon carbide body 100 may be planar or ribbed. A mean plane of the first main surface 101 extends along horizontal directions. The mean plane of a planar first main surface 101 is identical with the planar first main surface 101. In case of a non-planar first main surface 101, for example in case of a ribbed first main surface 101, the mean plane may be a planar least squares plane. Position and orientation of the planar least squares plane are defined such that the sum of the squares of the deviations of surface points of the ribbed first main surface 101 from the planar least squares plane has a minimum.

A vertical direction is orthogonal to the horizontal directions, e.g. parallel to the surface normal onto the mean plane. The horizontal directions are also referred to as lateral directions in the following.

The vertical direction may coincide with a main lattice direction or may be tilted to a main lattice direction by an off-axis angle, wherein the off-axis angle may be in a range from 2° to 8°, in particular about 4°. Opposite to the front side, a second main surface may extend parallel to the planar first main surface 101 or parallel to the least squares plane of a ribbed first main surface 101.

The silicon carbide device 500 includes a plurality of insulated gate transistor cells TC electrically connected in parallel and formed at the front side of the silicon carbide body 100. A drain/drift region 130 laterally extends through the silicon carbide body 100 between the insulated gate transistor cells TC and the second main surface. The drain/drift region 130 may include a voltage sustaining structure, e.g., a lightly doped drift zone 131.

Each insulated gate transistor cell TC includes a source region 110 and a body region 121. The source region 110 and the body region 121 are doped portions of the silicon carbide body 100. The source region 110 has a first conductivity type. The body region 121 has a second conductivity type. For example, the source region 110 is n conducting, the body region 121 is p conducting, and the drift zone 131 is n conducting.

The body region 121 may form part of a contiguous doped region of the second conductivity type, wherein the doped region includes further portions, for example a junction termination portion, a shielding portion, and/or a contact portion, by way of example.

A well region 410 of the second conductivity type extends from the first main surface 101 into the drain/drift region 130. The well region 410 and the drain/drift region 130 may form a pn junction. The drain/drift region 130 may surround the well region 410 on all sides within the silicon carbide body 100.

The body regions 121 of the transistor cells TC and the well region 410 may have the same vertical dopant profile and may result from the same ion implantation process (es). In particular, one single implant mask may define the well region 410 and the body region 121.

A first clamp region 411 of the first conductivity type extends from the first main surface 101 into the well region 410. The first clamp region 411 and the well region 410 form a pn junction. The well region 410 surrounds the first clamp region 411 on all sides within the silicon carbide body 100.

A second clamp region 412 of the first conductivity type extends from the first main surface 101 into the well region 410. The second clamp region 412 and the well region 410 form a pn junction. The well region 410 surrounds the second clamp region 412 on all sides within the silicon carbide body 100. The first clamp region 411 and the second clamp region 412 are laterally separated.

The source regions 110 of the transistor cells TC, the first clamp region 411, and the second clamp region 412 may have the same vertical dopant profile and may result from the same ion implantation process(es). In particular, one single implant mask may define the source regions 110, the first clamp region 411, and the second clamp region 412.

A first low-resistive ohmic path 901 electrically connects the first clamp region 411 and the gate electrodes 155 of the transistor cells TC. A gate terminal G and the first low-resistive ohmic path 901 are electrically connected.

A second low-resistive ohmic path 902 electrically connects the source regions 110 and the body regions 121 of the transistor cells TC with the second clamp region 412. A first load terminal S/E and the second low-resistive ohmic path 902 are electrically connected.

The first load terminal S/E may be the source terminal of an MOSFET or the emitter terminal of an IGBT. The drain/drift region 130 is electrically connected or coupled through a further pn junction to a second load terminal D/C. The second load terminal D/C may be the drain terminal of an MOSFET or the collector terminal of an IGBT.

A $p^+$ conductive buried region 425 is formed between the well region 410 and the drain/drift region 130. The buried region 425 and the well region 410 form a unipolar junction. The buried region 425 and the drain/drift region 130 form a pn junction. A mean net dopant density $N_2$ of the buried region 425 is higher than a mean net dopant density $N_1$ in the well region 410. The buried region 425 shields the well region 410 with the first and second clamp region 411, 412 against the potential applied to the drain/drift region 130.

The first clamp region 411, the well region 410 and the second well region 412 form a bidirectional clamp 800. The silicon carbide device 500 may include a plurality of spatially separated well regions 410 with first and second clamp regions 411, 412, wherein the bidirectional clamps 800 of different well regions 410 may be electrically connected in series or in parallel.

In FIG. 1A the transistor cell TC includes a planar gate electrode 155 formed on the first main surface 101. A gate dielectric 159 formed on the first main surface 101 separates the body region 121 and the gate electrode 155.

In FIG. 1B the transistor cell TC includes a trench gate electrode 155 formed in a trench that extends from the first main surface 101 into the silicon carbide body 100. The gate dielectric 159 may line the trench and separates at least the body region 121 and the gate electrode 155.

According to FIG. 1C the bidirectional clamp 800 clamps a gate voltage $V_{GSE}$ between the gate terminal G and the first load terminal S/E. For n-channel transistor cells TC, the positive clamp voltage is defined by the avalanche breakdown voltage of the pn junction between well region 410 and the first clamp region 411. An upper boundary for the amount of the negative clamp voltage is defined by the avalanche breakdown voltage of the pn junction between the well region 410 and the second clamp region 412.

In FIGS. 2A-2B the silicon carbide devices 500 are n-channel MOSFETs with $n^+$ conductive source regions 110 electrically connected to source terminals S, $n^-$ conductive drift zones 131, p conductive well regions 410 electrically connected to drain terminals D, and $n^+$ conductive first and second clamp regions 411, 412.

An interlayer dielectric 210 is formed on the first main surface 101. A first load metallization 310 and a gate metallization 330 are formed on the front side. The first load metallization 310 includes a load pad 315 and edge conductors 311 formed on the interlayer dielectric 210. The first load metallization 310 further includes load contact structures 319 extending from the load pad 315 through openings in the interlayer dielectric 210 to the source regions 110, to the body regions 121, and, if applicable, to the second clamp region 412. Alternatively or in addition, the first load metallization 310 may include edge contact structures 318 extending from the edge conductor 311 through openings in the interlayer dielectric 210 to the second clamp region 412.

Along the interface to the load contact structure 319, the body region 121 may include a heavily doped body contact region 129, wherein the load contact structure 319 and the body contact region 129 form a low-resistive ohmic metal/semiconductor contact.

The gate metallization 330 includes a gate pad 335 and gate conductors 331 formed on the interlayer dielectric 210. The gate metallization 330 further includes gate contact structures 339 extending from the gate pad 335 and/or from the gate conductor 331 through openings in the interlayer dielectric 210 to the gate electrodes 155. The gate metallization 330 may include clamp contact structures 338 extending from the gate pad 335 and/or from the gate conductor 331 through openings in the interlayer dielectric 210 to the first clamp regions 411.

The first load metallization 310 at the front side forms or is electrically connected with the source terminal S. A second load metallization 320 is in contact with the second main surface 102 on the back side and forms or is electrically connected with the drain terminal D. The drain/drift region 130 includes a more heavily doped $n^+$ conductive contact layer 139 along the second main surface 102, wherein the contact layer 139 and the second load metallization 320 form a low-resistive ohmic contact.

An $n^-$ conductive front side portion 132 of the drain/drift region 130 may extend from the first main surface 101 to a layer portion of the drain/drift region 130 below the well region 410. The front side portion 132 may be laterally between the well region 410 and neighboring p conductive regions, e.g., a doped well including the body regions 121 of the transistor cells TC and/or p conductive regions of termination structures such as a JTE (junction termination extension), a VLD (variation of lateral doping) region and/or guard rings.

FIG. 2A illustrates a silicon carbide device 500 with planar gate structure 150 and with a front side portion 132 of the drain/drift region 130 between the well region 410 and a p conductive doped well including the body region 121 of a transistor cell TC. The p conductive, doped well may include a shielding region 125 between the body region 121 and the drain/drift region 130. The shielding region 125 has a higher maximum net dopant concentration than the body region 121.

The shielding regions 125 of the transistor cells TC and the buried region 425 along the well region 410 may be formed at a same distance to the first main surface 101, may have the same vertical dopant profile, and may result from the same ion implantation process (es). In particular, one single implant mask may define the shielding region 125 and the buried region 425.

FIG. 2B illustrates a silicon carbide device 500 with trench gate structure 150 and asymmetric transistor cells TC, wherein an inversion channel is formed only at an active sidewall of the trench gate structure 150. The source region 110 and the body region 120 are formed only along the active sidewall.

A shielding region 125 is formed along a lower portion of the inactive sidewall and along a directly adjoining section of the trench gate structure bottom surface. The shielding region 125 has a higher maximum net dopant concentration than the body region 121.

The shielding regions 125 of the transistor cells TC and the buried region 425 along the well region 410 may be formed at a same distance to the first main surface 101, may have the same vertical dopant profile, and may result from the same ion implantation process (es). In particular, one single implant mask may define the shielding region 125 and the buried region.

A connection region 126 extends along the inactive sidewall of the trench gate structure 150 from the first main surface 101 to the shielding region 125. The connection region 126 has a higher mean net dopant concentration than the body region 121. Along the first main surface 101 a dopant concentration in the connection region 126 is high enough such that the first load metallization 310 and the connection region 126 form a low-resistive ohmic contact.

A lateral region 426 laterally surrounds the well region 410. The lateral region 426 and the well region 410 form a unipolar junction. The lateral region 426 and the drain/drift region 130, in particular the lateral region 426 and the front side portion 132 of the drain/drift region 130 form a vertical pn junction. The lateral region 426 extends from the first main surface 101 to or into the buried region 425. The buried region 425 and the lateral region 426 form a contiguous shell enclosing the well region 410 in the silicon carbide body 100.

The connection regions 126 of the transistor cells TC and the lateral region 426 along the well region 410 may have the same vertical dopant profile and may result from the same ion implantation process(es). In particular, one single implant mask may define the connection region 126 and the lateral region 426.

Figure 3A:
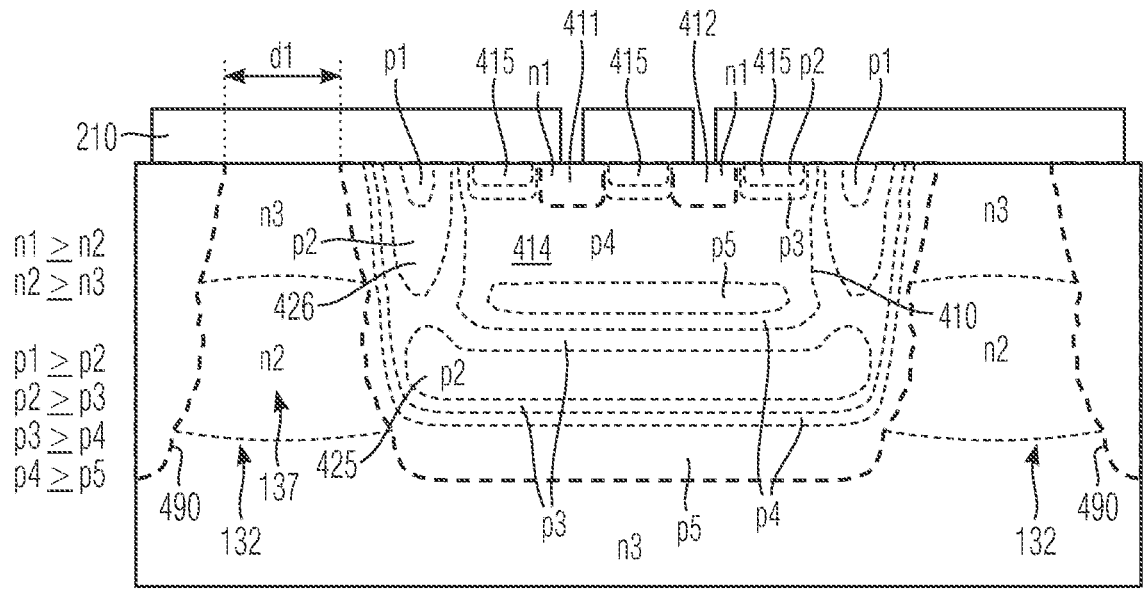
FIG. 3A shows a schematic vertical cross-sectional view of a portion of a silicon carbide device with an integrated symmetric bidirectional clamp according to an embodiment with a first and a second clamp region extending into a well region.

FIG. 3A shows an example for a symmetric bidirectional clamp 800 with fine-tuned clamp voltages. A p conductive well region 410 extends from a first main surface 101 into an n conductive drain/drift region 130. An n+ conductive first clamp region 411 and an n+ conductive second clamp region 412 extend from the first main surface 101 into the well region 410. The first and second clamp regions 411, 412 are laterally separated from each other and are formed symmetric with respect to a central plane orthogonal to the cross-sectional plane.

A buried region 425 separates the well region 410 and the drain/drift region 130 along the vertical direction. A lateral region 426 separates the well region 410 and the drain/drift region 130, in particular, the well region 410 and a front side portion 132 of the drain/drift region 130 along the lateral directions.

The well region 410 includes a lower doped main portion 414 and a more heavily doped enhanced portion 415. The enhanced portion 415 extends from the first main surface 101 into the well region 410. A first part of the enhanced portion laterally extends from the first clamp region 411 to the second clamp region 412. A second part of the enhanced portion 415 may surround the first clamp region 411, the second clamp region 412 and the first part of the enhanced portion 415. The second part of the enhanced portion 415 may be spaced from a lateral boundary of the well region 410 or may extend up to the lateral boundary of the well region 410.

Figure 3B:
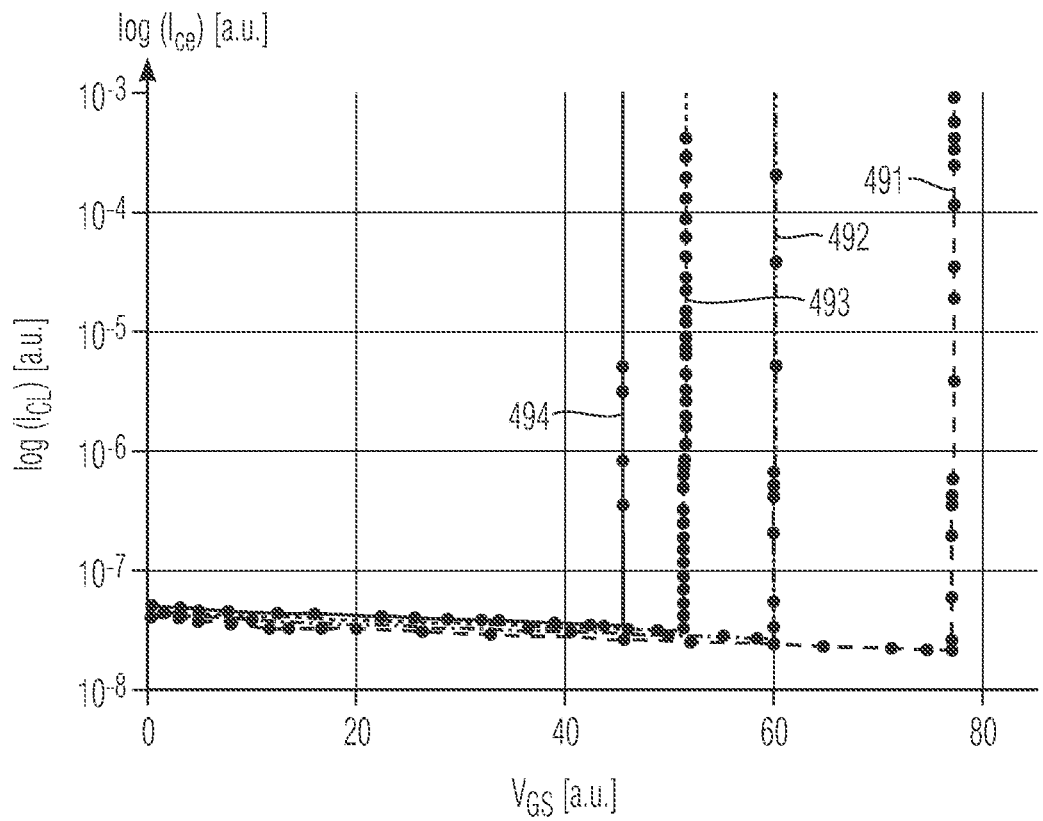
FIG. 3B shows a schematic diagram illustrating breakdown characteristics of the bidirectional clamp of FIG. 3A.

FIG. 3B shows positive breakdown characteristics of the bidirectional clamp 800 of FIG. 3A as a plot of the clamp current $I_{CL}$ vs. a positive gate-to-source voltage $V_{GS}$ and as a function of a net dopant dose in the enhanced portion 415 of the well region 410 in FIG. 3A.

A first line 491 shows the positive breakdown characteristic for a net dopant dose of 1.0E13 cm$^{-2}$ ($10^{13}$ cm$^{-2}$), a second line 492 for a net dopant dose of 2.5E13 cm$^{-2}$ (2.5×$10^{13}$ cm$^{-2}$), a third line 493 for a net dopant dose of 5.0E13 cm$^{-2}$ (5×$10^{13}$ cm$^{-2}$), and a fourth line 492 for a net dopant dose of 1.0E14 cm$^{-2}$ (101 cm$^{-2}$) in the enhanced portion 415. The Avalanche breakdown voltage decreases with increasing net dopant dose in the enhanced portion 415 in the well region and can be finely tuned by the dopant dose. It can also be shown, that the Avalanche breakdown voltage is highly invariant against process fluctuations and operating conditions of the silicon carbide device 500.

Since the required dose for the enhanced portion 415 of the well region 410 is comparatively low compared to the n dopant dose in the source regions 110, a masking of the source regions 110 may be omitted for the ion implants defining the enhanced portion 415. In particular, one single mask may be used to define the enhanced portion 415 and the body contact regions 129 of FIG. 2B and/or to define the enhanced portion 415 and a surface section of the connection regions 126 of FIG. 2B.

FIG. 4 shows a silicon carbide device 500 which includes a silicon carbide body 100, a first load metallization 310, a gate metallization 330, a drain/drift region 130, a well region 410, a first clamp region 411, a second clamp region 412, a buried region 425 and a lateral region 426 as described with reference to FIGS. 2A-2B and 3A.

The silicon carbide device 500 includes a plurality of transistor cells TC with stripe-shaped trench gate structures 150. Longitudinal axes of the gate structures 150 extend along a horizontal direction parallel to a y-axis. Each gate structure 150 includes a conductive gate electrode 155 and a gate dielectric 159 between the gate electrode 155 and the silicon carbide body 100. The gate electrode 155 may include heavily doped polycrystalline silicon. The gate dielectric 159 may consist of or may include silicon oxide, silicon nitride and/or siliconoxynitride.

An active sidewall 151 of each gate structure 150 is parallel or at least approximately parallel to a crystal plane with high charge carrier mobility, e.g. parallel to a <11-20> lattice plane. The active sidewall 151 may be tilted to the vertical z-axis by an off-axis angle of about 4 degrees.

The source region 110 of each transistor cell TC is formed along the first main surface 101 and in contact with the active sidewall 151. The body region 121 forming pn junctions with the source region 110 and the drain/drift region 130 is in contact with the active sidewall 151 and vertically separates the source region 110 and the drain/drift region 130. The drain/drift region 130 may include a lightly doped drift zone 131, more heavily doped current spread regions 137 between the drift zone 131 and the body regions 121 and a heavily doped contact portion 139 formed along the second main surface 102.

A shielding region 125 is in contact with a portion of the gate structure bottom surface 153 at a side opposite to the active sidewall 151 and may extend from the bottom surface 153 into the direction of the second main surface 102. The shielding region 125 and the drain/drift region 130 form a pn junction.

A connection region 126 with the conductivity type of the shielding region 125 extends along the inactive sidewall 152 from the first main surface 101 to or into the shielding region 125 and may form a unipolar junction with the body region 121 of the neighboring transistor cell TC. At least along the first main surface 101, a dopant concentration in the connection regions 126 is sufficiently high such that the connection regions 126 and the metal load contact structures 319 form low-resistive ohmic semiconductor/metal contacts. A front side portion 132 of the drain/drift region 130 may laterally separate the lateral region 426 and the neighboring p doped regions of the transistor cells TC.

A mean net dopant concentration in the lateral region 426 and a mean net dopant concentration in the buried region 425 are sufficiently high to avoid an unintentional turn on of the parasitic npn bipolar transistor including the n doped clamp regions 411, 412, the p doped well region 410 and the n doped drift zone 131. Formation of the well region 410, the lateral region 426 and the buried region 425 may share implantation steps used for forming the body regions 121, the connection regions 126 and the shielding regions 125 of the transistor cells TC and may be defined by modifying existing implant masks for the body region, the shielding region 125 and the connection region 126.

A maximum net dopant concentration in the first and second clamp regions 411, 412 is selected sufficiently high to form low-resistive ohmic contacts between the first clamp region 411 and the gate metallization 330 and between the second clamp region 412 and the source metallization 310, and is selected sufficiently low to achieve the desired breakdown voltage for the bidirectional clamp, e.g. a breakdown voltage of at least 100V, 80V, 60V or 50V. The maximum net dopant concentration in the first and second clamp regions 411, 412 may be equal to or approximately equal to the maximum net dopant concentration in the source regions 110.

Figure 5A:
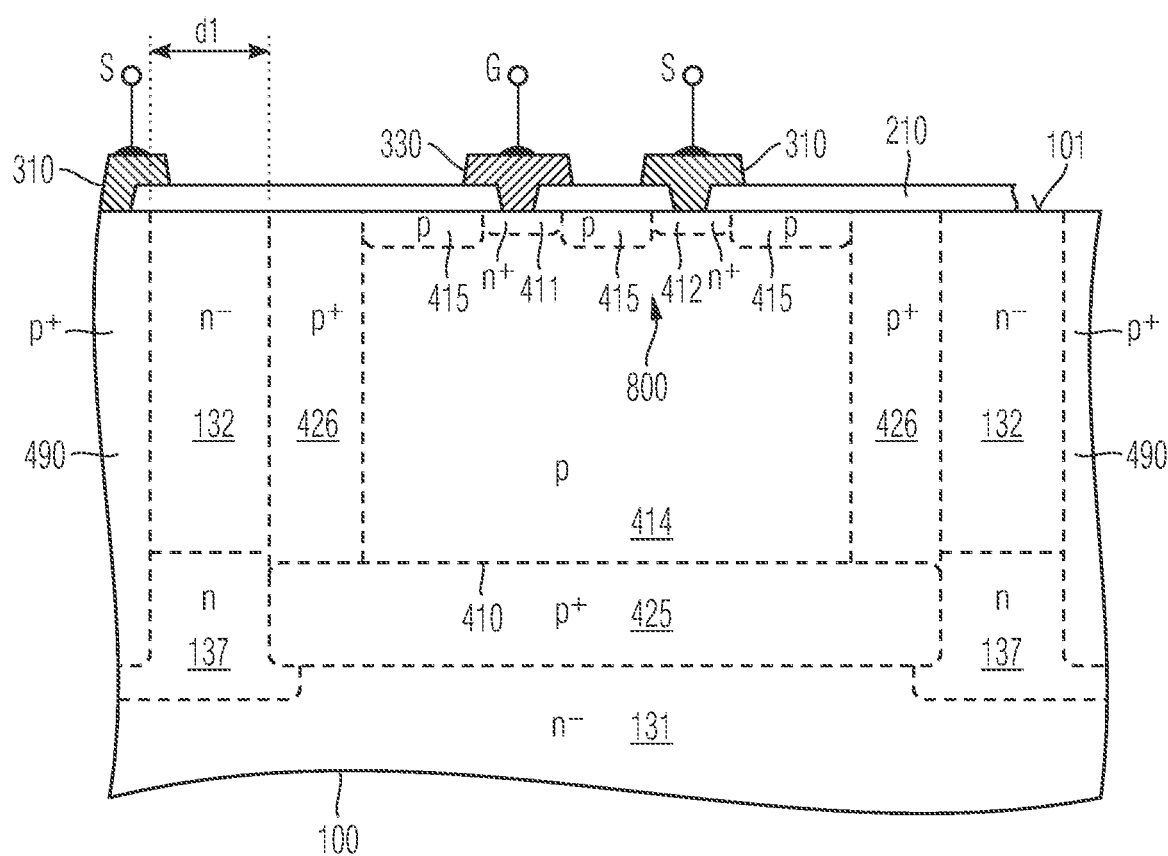
FIGS. 5A-5D show schematic vertical cross-sectional views of portions of silicon carbide devices with an integrated symmetric bidirectional clamp according to embodiments including well regions including enhanced portions.

In FIG. 5A the current spread regions 137 directly adjoin the p doped structure including the well region 410, the buried region 425 and the lateral region 426. The current spread regions 137 may be formed between the drift zone 131 and the front side portion 132 of the drain/drift region 130. A net dopant concentration in the current spread regions 137 is higher than in the front side portion 132 and higher than in the drift zone 131.

Since the dopant concentration in the current spread regions 137 is sufficiently low, the current spread regions 137 may be formed as portions of a contiguous current spread layer which may be formed by an unmasked ion implantation or by an ion implantation process using a simple mask covering only a termination region of each chip region of a silicon carbide wafer without inverse impact on the breakdown characteristics of the bidirectional clamp 800.

In addition, FIG. 5A shows auxiliary well structures 490 formed at a lateral distance d1 to the p conductive structure including the well region 410, the lateral region 426 and the buried region 425. The auxiliary well structure 490 and the first load metallization 310 form a low resistive ohmic contact. The lateral distance d1 and the dopant concentration in the front side portion 132 may define a lower clamp voltage for negative gate transients than the Avalanche breakdown voltage between the second clamp region 412 and the well region 410. At the gate electrodes of the transistor cells, negative voltage pulses with an amplitude in the range of few volts may occur when the silicon carbide device 500 switches negative loads. Negative voltage pulses at the gate electrodes may adversely affect long-time stability of the gate threshold voltage. Using the pnp structure between the auxiliary well structure 490, the front side portion 132 and the well region 410 as clamp facilitates an asymmetric clamping and facilitates clamping of negative voltage pulses with comparatively low amplitude.

Figure 5B:
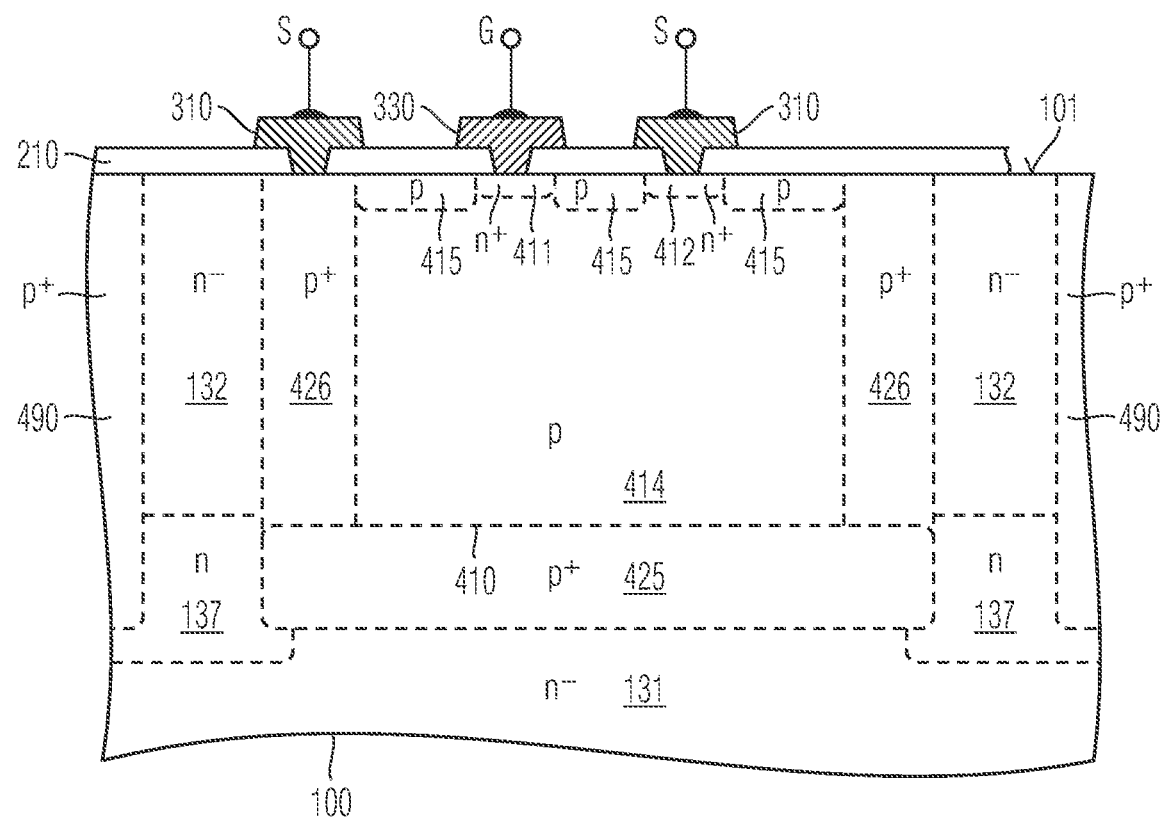

FIG. 5B shows a direct low-resistive ohmic contact between the first load metallization 310 and the lateral region 126, wherein the lateral region 426 is in direct contact with an outer part of the enhanced portion 415.

The well region 410 and the first clamp region 411 form a pn junction which is forward-conducting when a negative voltage between the gate terminal G and the source terminal S exceeds the set-in voltage of the pn junction. The direct low-resistive ohmic contact between the first load metallization 310 and the lateral region 126 facilitates a comparatively low negative clamp voltage, which may be well decoupled from operation conditions, such as the current blocking voltage.

Figure 5C:
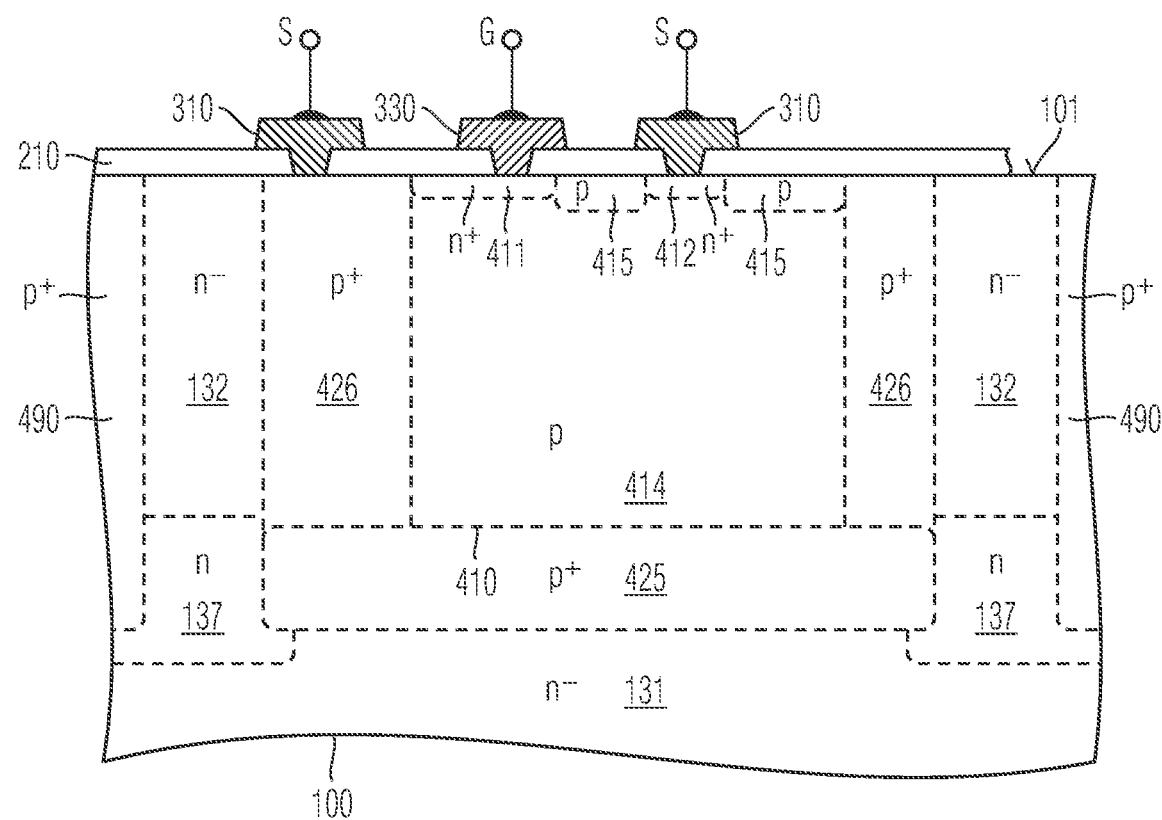

In FIG. 5C the lateral region 426 is in direct lateral contact with the first clamp region 411.

Figure 5D:
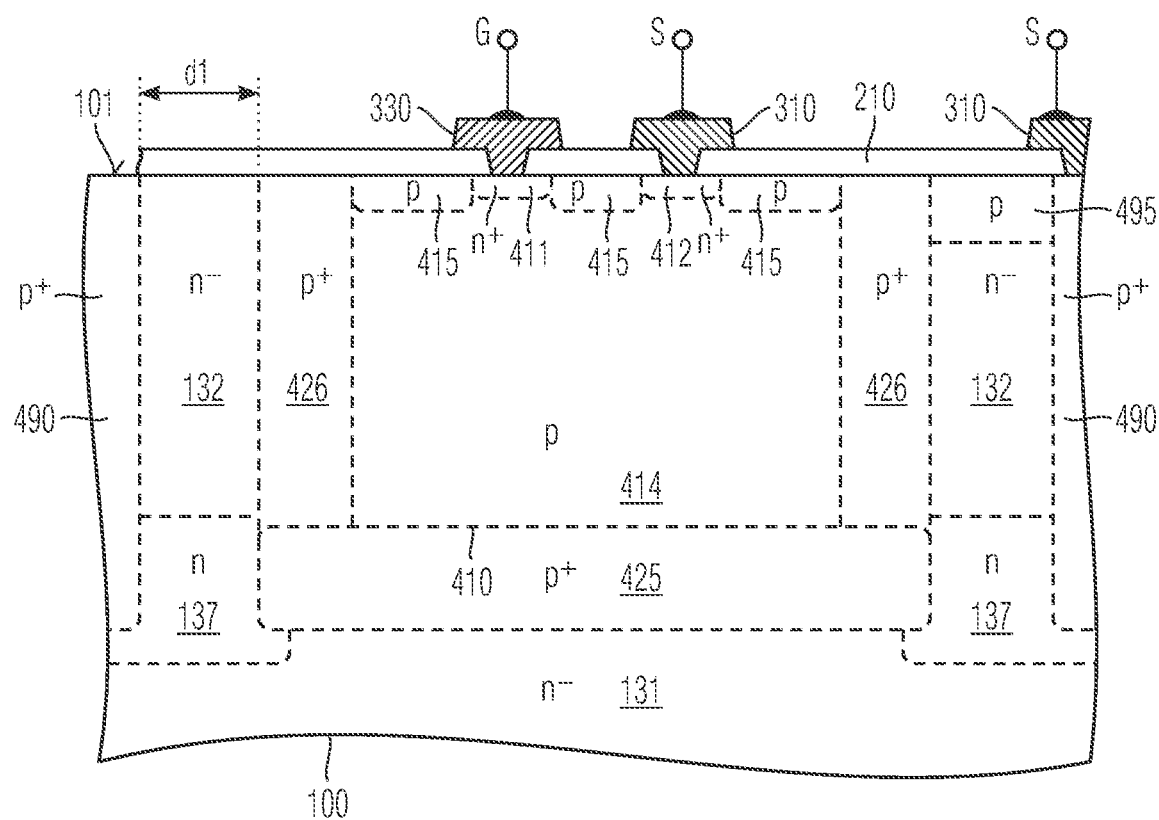

The silicon carbide device 500 in FIG. 5D differs from the silicon carbide device 500 in FIG. 5A in that a high resistive connection region 495 of the second conductivity type electrically connects the p conductive structure including the well region 410, the lateral region 426 and the buried region 425 with a neighboring auxiliary well structure 490. The connection region 495 is in series to the pn junction between the well region 410 and the first clamp region 411 which is forward-conducting when a negative voltage between the gate terminal G and the source terminal S exceeds the set-in voltage of the pn junction.

The connection region 495 may be formed in only a section of a vertical distance between the first main surface 101 and the drift zone 131, wherein the connection region 495 may extend along the first main surface 101 or may be spaced from the first main surface 101, e.g., by a portion of the front side portion 132 of the drain/drift structure 130. Alternatively, the connection region 495 may extend along the complete vertical distance between the first main surface 101 and the drift zone 131.

The connection region 495 may be formed in only a section of the lateral circumference of the p conductive structure including the well region 410, the buried region 425 and the lateral region 426 or may completely surround the p conductive structure including the well region 410, the buried region 425 and the lateral region 426.

The connection region 495 discharges charge carriers from the well region 410. In addition, the connection region 495 increases the load for a gate driver circuit that drives, in the off-state, a negative gate voltage exceeding the set-in voltage of the pn junction. The increased load reduces the gate driver output current and in this way the connection region 495 may reduce power consumption of such type of gate driver circuits.

Figure 6:
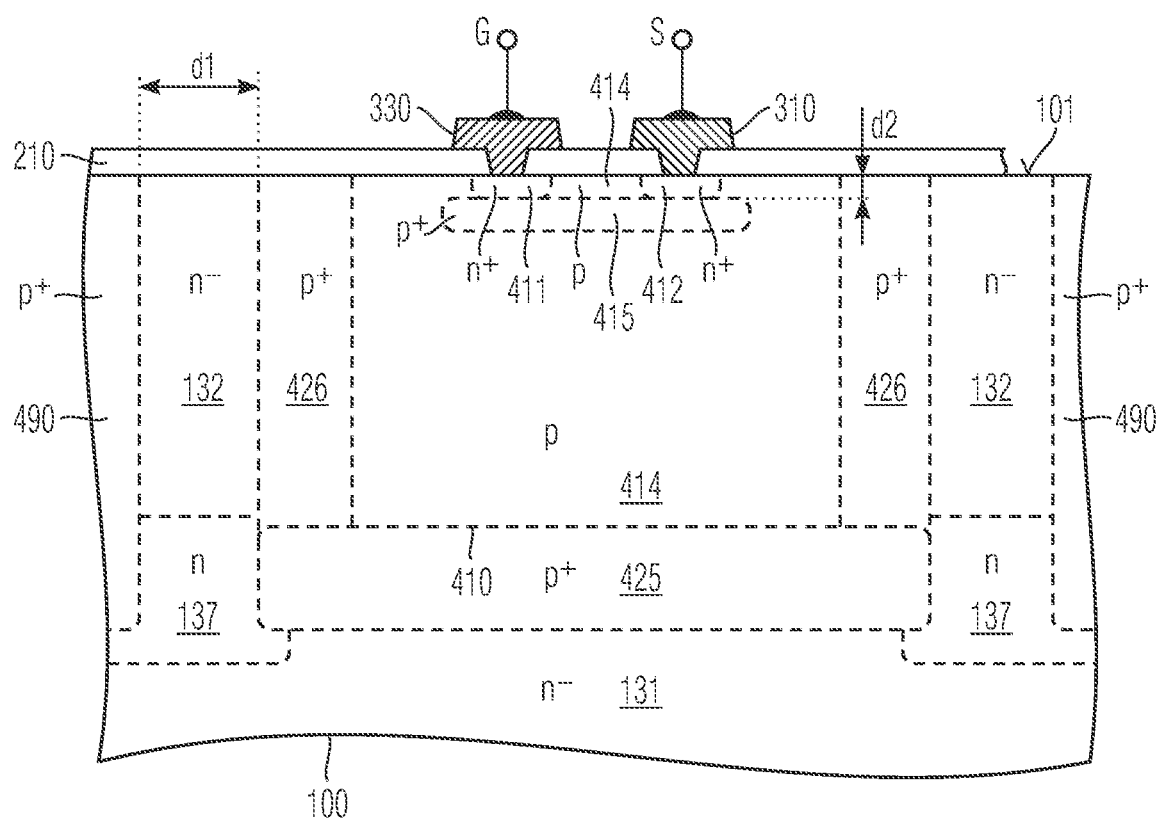
FIG. 6 shows a schematic vertical cross-sectional view of a portion of a silicon carbide device with an enhanced portion formed at a distance to a surface of the well region.

FIG. 6 shows the enhanced portion 415 of the well region 410 as a contiguous layer below the first and second clamp regions 411, 412. A vertical distance d2 between the first main surface 101 and the enhanced portion 415 may be at least 200 nm, e.g. at least 500 nm or at least 1 μm. The enhanced portion 415 may be in direct contact with the first and second clamp regions 411, 412 in the vertical direction.

Figure 7:
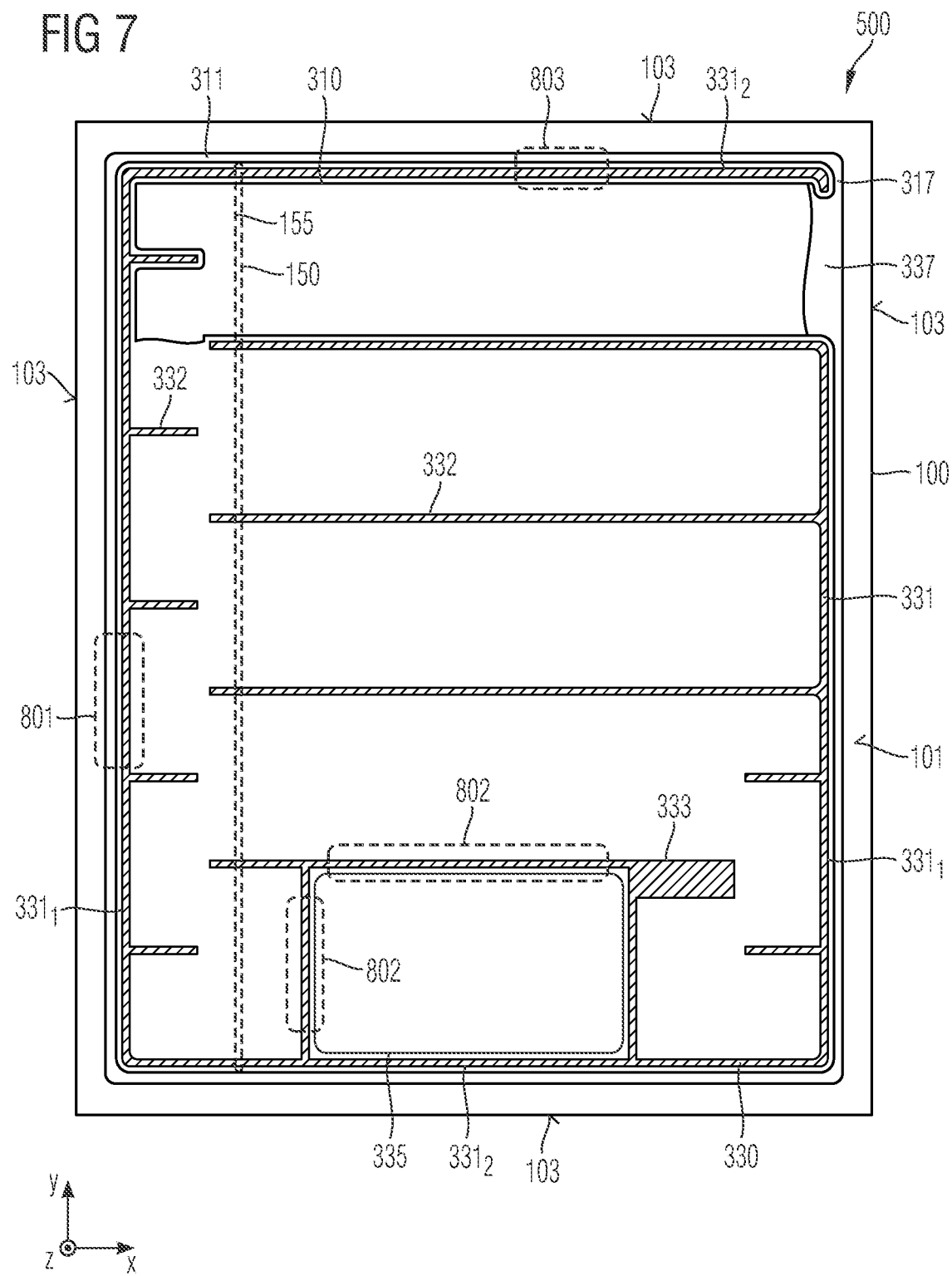
FIG. 7 shows a schematic plan view of a silicon carbide device indicating possible areas for a bidirectional clamp according to embodiments.

FIG. 7 shows a plan view of the front side of a silicon carbide body 100, wherein one illustrated stripe-shaped gate structure 150 is representative for a plurality of trench gate structures extending parallel to the y-axis. A first main surface 101 at the front side of the silicon carbide body 100 and a lateral surface 103 of the silicon carbide body 100 may form a front side chip edge with four straight portions oriented orthogonal to each other.

A gate metallization 330 includes a gate pad 335, an integrated gate resistor 333, gate conductors 331, 332, gate contact structures and clamp contact structures.

The gate pad 335 may be formed close to the chip edge, e.g., along a central part of a straight portion of the chip edge. The gate pad 335 may include a thin layer portion and a thick metallization formed on the thin layer portion. The thin layer portion may include elemental titanium, a titanium compound, e.g. titanium nitride (TiN), elemental tantalum (Ta), and/or a tantalum compound, e.g. tantalum nitride (TaN). The thick metallization may include elemental copper (Cu), a copper alloy, elemental aluminum (Al), an aluminum alloy and/or a copper aluminum alloy.

The integrated gate resistor 333 may include doped polycrystalline silicon. A first side of the integrated gate resistor 333 may be electrically connected to the gate pad 335. A second, opposite side of the integrated gate resistor 333 may be directly connected with at least one of the gate conductors 331, 332. The gate conductors 331, 332 include or consist of a thin layer portion. The thin layer portion of the gate conductors 331, 332 and the thin layer portion of the gate pad 335 may have the same structural configuration. For example, both thin layer portions may include the same material and may have the same thickness or may be formed from the same layer stack.

The gate conductors 331, 332 include stripe-shaped first gate runners $331_1$, stripe-shaped second gate runners $331_2$, and stripe-shaped gate fingers 332. The first gate runners $331_1$ have a longitudinal extension parallel to the y-axis. The second gate runners $331_2$ have a longitudinal extension parallel to the x-axis. The first and second gate runners $331_1$, $331_2$ form a frame along the chip edge, wherein the frame may have a gap 337. Longitudinal axes of the gate fingers 332 are parallel to the x-axis and intersect the gate structures 150. Each gate finger 332 is in contact with at least one gate runner 331. Each gate finger 332 electrically connects the gate electrodes 155 of a plurality of gate structures 150 directly or through gate contact structures. Each gate electrode 155 may be directly connected to a plurality of gate fingers 332.

A first load metallization 310 includes a load pad 315, an edge conductor 311, load contact structures and edge contact structures. The load pad 315 may include a thin layer portion and a power metallization formed on the thin layer portion. The thin layer portion may include elemental titanium, a titanium compound, e.g. titanium nitride (TiN), elemental tantalum (Ta), and/or a tantalum compound, e.g. tantalum nitride (TaN). The power metallization may include elemental copper (Cu), a copper alloy, elemental aluminum (Al), an aluminum alloy or a copper aluminum alloy. The power metallization of the load pad 315 and the thick metallization of the gate pad 335 may have the same structural configuration.

The load pad 315 may cover the gate fingers 332. Alternatively, the load pad 315 may include a plurality of interconnected load pad sections, wherein the gate fingers 332 are formed in gaps between neighboring load pad sections.

The edge conductor 311 may form a frame around the load pad 315, wherein the sections of the frame are formed between the gate runners $331_1$, $331_2$ and the chip edge. The edge conductor 311 includes a thin layer portion and may include a power metallization formed on the thin layer portion. The thin layer portion of the edge conductor 311 and the thin layer portion of the load pad 315 may have the same structural configuration and may form a contiguous structure extending through the gap 337 in the gate runner frame.

The silicon carbide device 500 may include at least one of a first clamp part 801 formed along a first gate runner $331_1$, a second clamp part 802 formed along an edge of the gate pad 335, and a third clamp part 803 formed along a second gate runner $331_2$.

The first clamp part 801 may extend along one or both first gate runners $331_1$. Along each first gate runner $331_1$ one single portion of the first clamp part 801 may be formed. The single portion may extend across at least half of the length of the first gate runner $331_1$ or across at least 90%. More than one portion may be formed along each first gate runner $331_1$.

The second clamp part 802 may extend along one, two, three or all edges of the gate pad 335. The second clamp part 802 may be one contiguous structure or may include two or more laterally separated portions.

The third clamp part 803 may extend along one or both second gate runners $331_2$. Along each second gate runner $331_2$ one single portion of the third clamp part 803 may be formed. The single portion may extend across at least half of the length of the second gate runner $331_2$ or across at least 90%. More than one portion may be formed along each second gate runner $331_2$.

A silicon carbide device 500 may exclusively include a first clamp part 801, a second clamp part 802, or a third clamp part 803, may include any combination of two of said clamp parts 801, 802, 803 or may include all three clamp parts 801, 802, 803.

Figure 8:
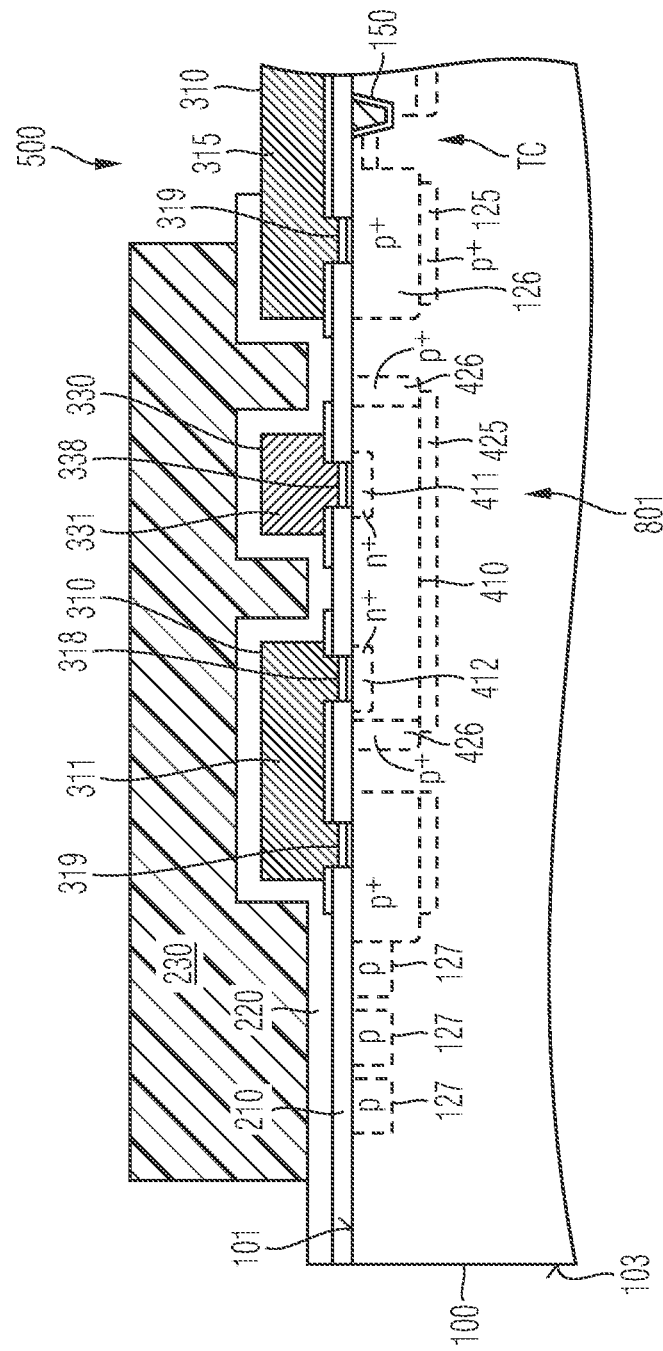
FIG. 8 shows a schematic vertical cross-sectional view of portions of silicon carbide devices according to embodiments with an integrated bidirectional clamp formed below a gate runner and an edge conductor.

FIG. 8 shows a first clamp part 801 with a first clamp region 411 and a second clamp region 412 extending into a well region 410 as illustrated in FIGS. 3A, 4, 5A-5D, and 6. The first clamp region 411 is formed directly below a first gate runner $331_1$ with a longitudinal axis parallel to the y-axis. The second clamp region 412 is formed directly below a portion of an edge conductor 311 between the first gate runner $331_1$ and the lateral surface 103 of the silicon carbide body 100. A first load contact structure 319 forms a low-resistive ohmic contact between a load pad 315 and a p conductive doped region at a side of the first gate runner $331_1$ opposite to the edge conductor 311. A second load contact structure 319 forms a low-resistive ohmic contact between the edge conductor 311 and a further p conductive doped region.

The p conductive doped regions may be connection regions 126 extending from the first main surface 101 to the shielding regions 125 as described above or may result from the same implantation process(es) as used for forming the connection regions 126.

Laterally separated guard rings 127 extend between the well region 410 and the lateral surface 103 from the first main surface 101 into the silicon carbide body 100. A dielectric passivation layer 220 extending inwardly from the lateral surface 103 to beyond an outer edge of the load pad 315 covers the edge conductor 311 and the first gate runner $331_1$. An imide layer 230 may cover a portion of the passivation layer 220.

Figure 9A:
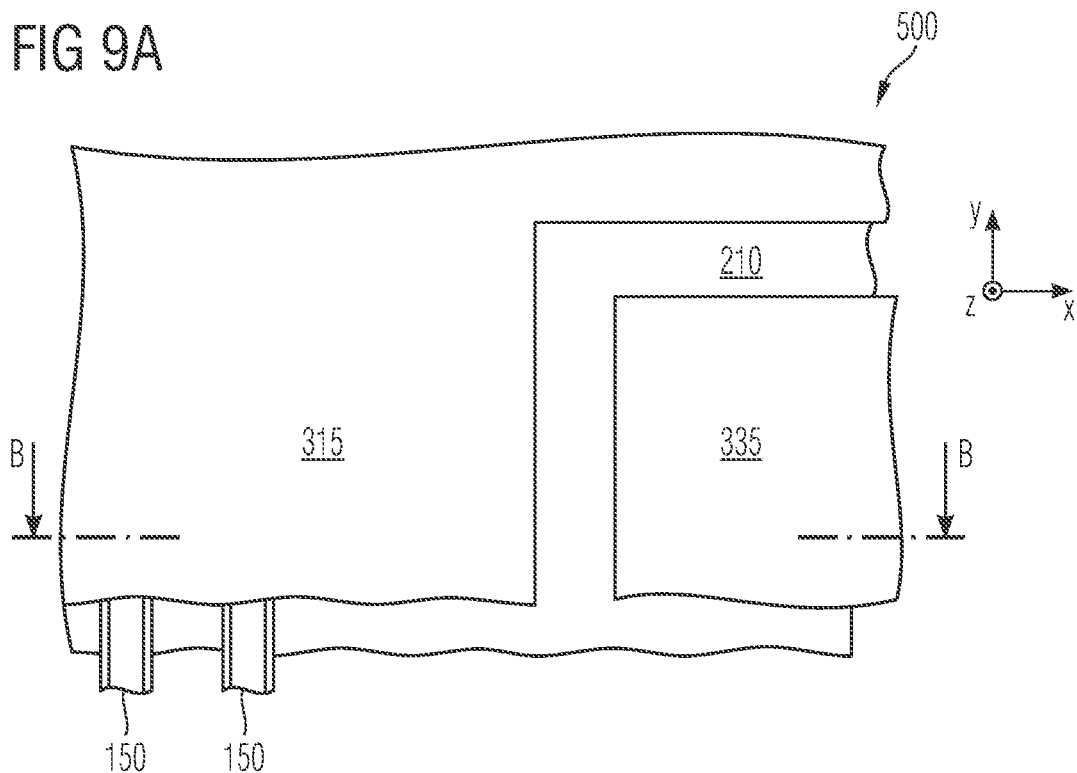
FIGS. 9A-9B show a simplified plan view and a corresponding simplified vertical cross-sectional view of a portion of a silicon carbide device with bidirectional clamp according to an embodiment with a first clamp region connected to a gate pad and with a second clamp region connected to a load pad.
Figure 9B:
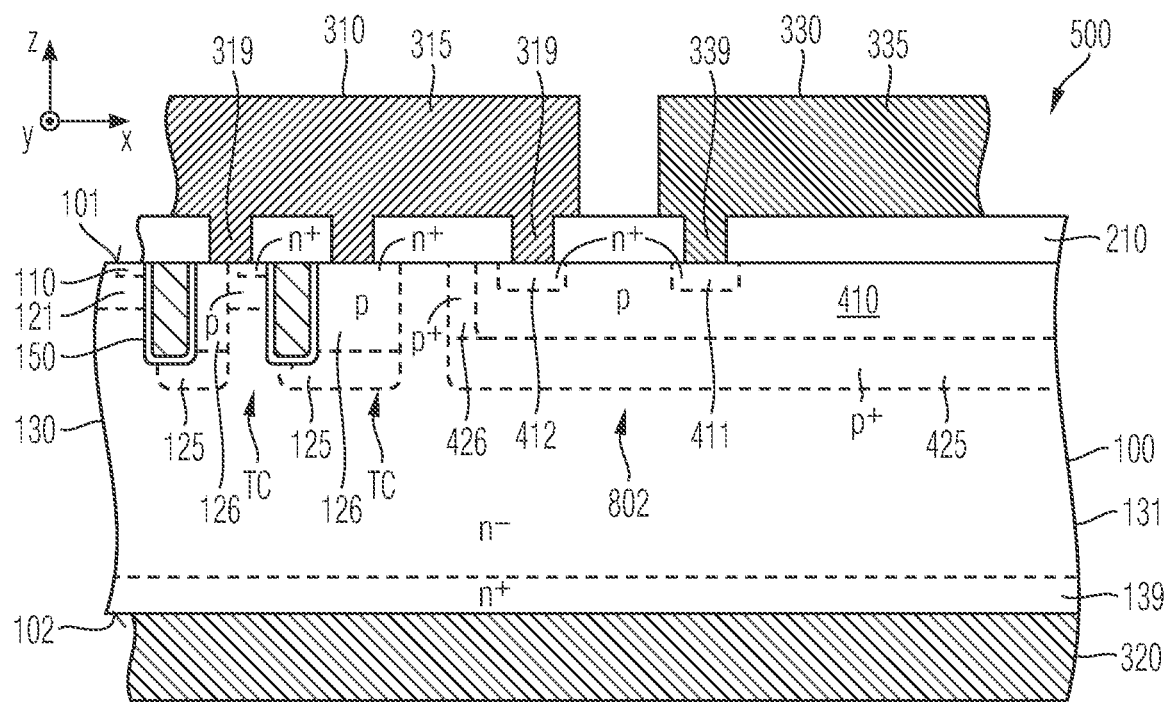

FIGS. 9A and 9B show a second clamp part 802 with the first clamp region 411 formed directly below an outer portion of a gate pad 335 and with the second clamp region 412 formed directly below a portion of a load pad 315 oriented to the gate pad 335. The well region 410 spans a gap between the load pad 315 and the gate pad 335.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A silicon carbide device, comprising:
a transistor cell comprising a gate electrode and a source region of a first conductivity type;
a drain/drift region formed in a silicon carbide body;
a well region of a second conductivity type;
a buried region of the second conductivity type, wherein the buried region and the drain/drift region form a pn junction, wherein the buried region and the well region form a unipolar junction, and wherein a mean net dopant density $N_2$ of the buried region is higher than a mean net dopant density $N_1$ of the well region;
a first clamp region of the first conductivity type, wherein the first clamp region extends into the well region, and wherein a first low-resistive ohmic path electrically connects the first clamp region and the gate electrode; and a second clamp region of the first conductivity type wherein the second clamp region extends into the well region, and wherein a second low-resistive ohmic path electrically connects the second clamp region and the source region.

2. The silicon carbide device of claim 1, further comprising:

a lateral region of the second conductivity type, wherein the lateral region laterally surrounds the well region, wherein the lateral region and the well region form a unipolar junction, and wherein a mean net dopant density $N_3$ of the lateral region is higher than the mean net dopant density $N_1$.

3. The silicon carbide device of claim 1, further comprising:

a gate metallization, wherein the gate metallization and the gate electrode are electrically connected, and wherein the gate metallization and the first clamp region form a low-resistive ohmic contact.

4. The silicon carbide device of claim 1, further comprising:

a first load metallization, wherein the first load metallization and the source region form a low-resistive ohmic contact, and wherein the first load metallization and the second clamp region form a low-resistive ohmic contact.

5. The silicon carbide device of claim 4, wherein the first load metallization and the lateral region and/or the first load metallization and the well region form a low-resistive ohmic contact.

6. The silicon carbide device of claim 4, further comprising:

an auxiliary well structure of the second conductivity type, wherein a front side portion of the drain/drift region is formed between the auxiliary well structure and the well region, and wherein the first load metallization and the auxiliary well structure form a low-resistive ohmic contact.

7. The silicon carbide device of claim 4, further comprising:

a connection region of the second conductivity type, wherein the connection region laterally extends from the well region or from the lateral region to the auxiliary well structure.

8. The silicon carbide device of claim 1, wherein a bidirectional clamp comprising the first clamp region and the second clamp region is configured to carry a breakdown current of at least 0.5 A.

9. The silicon carbide device of claim 1, wherein the well region, the first clamp region, and the second clamp region extend from a first main surface of the silicon carbide portion into the silicon carbide portion.

10. The silicon carbide device of claim 1, wherein the well region comprises a main portion and an enhanced portion, wherein a mean net dopant density in the enhanced portion is higher than in the main portion, and wherein at least a first part of the enhanced portion is between the first clamp region and the second clamp region.

11. The silicon carbide device of claim 10, wherein the enhanced portion is spaced from a first main surface at a front side of the silicon carbide body.

12. The silicon carbide device of claim 10, wherein a second part of the enhanced portion laterally surrounds the first and second clamp regions.

13. A silicon carbide device, comprising:

a transistor cell comprising a gate electrode and a source region of a first conductivity type;

a drain/drift region formed in a silicon carbide body;

a well region of a second conductivity type;

a lateral region of the second conductivity type, wherein the lateral region laterally surrounds the well region, wherein the lateral region and the well region form a unipolar junction, and wherein a mean net dopant density $N_3$ of the lateral region is higher than a mean net dopant density $N_1$ of the well region;

a first clamp region of the first conductivity type, wherein the first clamp region extends into the well region, and wherein a first low-resistive ohmic path electrically connects the first clamp region and the gate electrode; and a second clamp region of the first conductivity type, wherein the second clamp region extends into the well region, and wherein a second low-resistive ohmic path electrically connects the second clamp region and the source region.

14. A silicon carbide device, comprising:

a transistor cell comprising a gate electrode and a source region of a first conductivity type;

a drain/drift region formed in a silicon carbide body;

a well region of a second conductivity type;

a first clamp region of the first conductivity type, wherein the first clamp region extends into the well region, and wherein a first low-resistive ohmic path electrically connects the first clamp region and the gate electrode; and a second clamp region of the first conductivity type, wherein the second clamp region extends into the well region, and wherein a second low-resistive ohmic path electrically connects the second clamp region and the source region, wherein the well region comprises a main portion and an enhanced portion, wherein a mean net dopant density in the enhanced portion is higher than in the main portion, and wherein at least a first part of the enhanced portion is between the first clamp region and the second clamp region.

* * * * *